United States Patent
Ahles et al.

(10) Patent No.: US 9,082,831 B2
(45) Date of Patent: Jul. 14, 2015

(54) COMPONENT HAVING A VIA

(75) Inventors: Marcus Ahles, Pfullingen (DE); Jochen Reinmuth, Reutlingen (DE); Hubert Benzel, Pliezhausen (DE); Simon Armbruster, Wannweil (DE)

(73) Assignee: ROBERT BOSCH GMBH, Stuttgart (DE)

( * ) Notice: Subject to any disclaimer, the term of this patent is extended or adjusted under 35 U.S.C. 154(b) by 215 days.

(21) Appl. No.: 13/199,748

(22) Filed: Sep. 7, 2011

(65) Prior Publication Data

US 2012/0068356 A1    Mar. 22, 2012

(30) Foreign Application Priority Data

Sep. 21, 2010  (DE) .................. 10 2010 041 101

(51) Int. Cl.
  *H01L 23/48* (2006.01)
  *H01L 21/768* (2006.01)
  *B81C 1/00* (2006.01)
  *H01L 21/764* (2006.01)

(52) U.S. Cl.
  CPC ...... *H01L 21/76898* (2013.01); *B81C 1/00095* (2013.01); *H01L 21/764* (2013.01); *H01L 23/481* (2013.01); *B81B 2201/0264* (2013.01); *H01L 2224/02372* (2013.01); *H01L 2224/0401* (2013.01); *H01L 2224/0557* (2013.01); *H01L 2224/05548* (2013.01); *H01L 2224/131* (2013.01); *H01L 2924/00014* (2013.01); *H01L 2924/1461* (2013.01)

(58) Field of Classification Search
  USPC .................. 257/276, 686, 774, 777, E23.011, 257/E21.597; 438/109, 667
  See application file for complete search history.

(56) References Cited

U.S. PATENT DOCUMENTS

| | | | | |
|---|---|---|---|---|
| 5,457,344 | A * | 10/1995 | Bartelink | ...................... 257/737 |
| 6,815,827 | B2 * | 11/2004 | Vieux-Rochaz et al. | ...... 257/775 |
| 2008/0197512 | A1* | 8/2008 | Marchi et al. | ................. 257/784 |
| 2010/0044853 | A1* | 2/2010 | Dekker et al. | ................. 257/692 |
| 2010/0090338 | A1 | 4/2010 | Lee et al. | |

FOREIGN PATENT DOCUMENTS

| | | |
|---|---|---|
| DE | 10 2004 036 032 | 7/2005 |
| DE | 10 2004 036 035 | 7/2005 |
| DE | 10 2007 035 060 | 1/2009 |
| WO | WO 02/02458 | 1/2002 |

* cited by examiner

*Primary Examiner* — Caleb Henry
(74) *Attorney, Agent, or Firm* — Kenyon & Kenyon LLP

(57) ABSTRACT

A component having a via includes: (i) a first layer having a first via portion, a first trench structure, and a first surrounding layer portion, the first via portion being separated by the first trench structure from the first surrounding layer portion; (ii) a second layer having a second via portion, a second trench structure, and a second surrounding layer portion, the second via portion being separated by the second trench structure from the second surrounding layer portion; (iii) an insulation layer disposed between the first and the second layer, the insulation layer having an opening so that the first and the second via portions of the first and the second layers are directly connected to one another in the region of the opening. The first via portion and the second surrounding layer portion at least partially overlap.

6 Claims, 19 Drawing Sheets

COMPONENT HAVING A VIA

BACKGROUND OF THE INVENTION

1. Field of the Invention

The present invention relates to a component having a via, and to a method for manufacturing a component having a via.

2. Description of the Related Art

Electrical contact structures that extend through a component or through a substrate of a component are known in a variety of embodiments. Such contact structures, which are also referred to as a "via" (vertical interconnect access), "through contact," or "through-plated contact," are becoming increasingly significant because they offer advantages such as, for example, a space-saving configuration for a component. It is also possible to dispose multiple components vertically above one another and to connect them electrically via pertinent vias, with the result that assemblages having small lateral dimensions can be implemented. In the case of sensors or sensor elements, vias can furthermore be used to create an electrical connection between contact structures on a back side and sensor structures on a front side, thus enabling "back-side contacting" of the sensor. A configuration of this kind is appropriate, for example, for pressure sensors using the piezoresistive converter principle, conventional embodiments of which (not having a through contact) are described in, e.g., published PCT international patent application document WO 02/02458 A1, and published German patent application documents DE 10 2004 036 032 A1 and DE 10 2004 036 035 A1.

Known methods for manufacturing components having vias are based on insulating from the surrounding substrate material a substrate region of an electrically conductive substrate that is to function as a "conductive trace." Provision is made for this purpose, for example, to generate a surrounding trench structure that is subsequently filled out or up with an insulating material. Such methods are, however, often associated with high complexity and consequently with high cost.

BRIEF SUMMARY OF THE INVENTION

The object of the present invention is to provide an improved solution for a component having a via.

According to the present invention, a component having a via is proposed, which component has a first layer and a second layer. The first layer has a first via portion, a first trench structure, and a first surrounding layer portion, the first via portion being separated by the first trench structure from the first surrounding layer portion. The second layer has a second via portion, a second trench structure, and a second surrounding layer portion, the second via portion being separated by the second trench structure from the second surrounding layer portion. The component further has an insulation layer disposed between the first and the second layer. The insulation layer has an opening, so that the first and the second via portion of the first and the second layer are connected directly to one another in the region of the opening. In addition, the first via portion of the first layer, and the second surrounding layer portion of the second layer, are disposed overlappingly with one another in at least one sub-region.

In the component, the via or the conductive part of the via is formed by the first and the second via portion, which are connected to one another in the region of the opening of the insulation layer. The pertinent trench structures, by way of which the two via portions are separated from the respectively surrounding layer portions, serve for lateral insulation. The insulation layer, conversely, enables vertical insulation, in particular with regard to the overlap, existing at least in a sub-region, of the first via portion and the second surrounding layer portion. A component of this kind can be manufactured relatively simply, since, in particular, no provision is made for filling a trench structure. Despite this circumstance, a high level of mechanical strength can be achieved in the via by way of the partial overlap of the first via portion and the second surrounding layer portion.

In a preferred embodiment, the first layer or the second layer is a semiconductor substrate. In this context the other layer (i.e. second or first layer) can be, for example, a functional layer in which functional or sensor structures are embodied.

In a further preferred embodiment, the second via portion of the second layer and the first surrounding layer portion of the first layer are (also) disposed overlappingly with one another at least in a sub-region. This mutual overlap of portions of the first and the second layer further promotes good mechanical stability of the via.

In a further preferred embodiment, the first and the second via portion of the first and the second layer are each provided with a metallization. The via can in this fashion be reliably contacted; a bonding wire, for example, can be used. It is also possible to use a soldering means, so that the component can, for example, be mounted onto another component in the context of an economical construction and connection technology.

In a further preferred embodiment the component has a sealing layer, respectively on the first and the second layer, with which the first and the second trench structure are respectively sealed. Penetration of, for example, dirt, particles, or a liquid into the trench structures, and short-circuiting caused thereby between a via portion and the respectively surrounding layer portion, can thereby be prevented. The production of mechanical stress (interference variable) as a result of such foreign materials, for example as a consequence of thermal expansion, can also be avoided. In one possible embodiment of the component in the form of a sensor or actuator, good long-term stability with regard to drift (because of temperature, moisture) can be achieved in this fashion.

In a further preferred embodiment, at least the sealing layer provided on the first layer has an opening that exposes a sub-region of the first via portion. The component further has a metallic layer that is disposed on the sealing layer and on the exposed sub-region of the first via portion. A metallic layer of this kind, like the metallization described above, can make possible reliable contacting of the via.

In a further preferred embodiment, provision is made that the sealing layer provided on the second layer has a covered conductive sub-layer that adjoins the second via portion. A configuration of this kind can be provided, for example, in the context of a sensor in order to connect functional or sensor structures provided in the second layer to the via by way of the covered conductive sub-layer. The covered configuration offers the possibility of imparting a high level of media resistance to the component or sensor.

Also proposed according to the present invention is a method for manufacturing a component having a via. The method encompasses preparing an assemblage made up of a first layer, a second layer, and an insulation layer disposed between the first and the second layer, the insulation layer having an opening so that the first and the second layer are directly interconnected in the region of the opening. The method further encompasses generating in the first layer a first trench structure, extending to the insulating layer, by way of which a first via portion is configured in the region of the opening of the insulation layer and a first surrounding layer portion, separated from the first via portion, is configured in the first layer. Also provided for is generation in the second layer of a second trench structure, extending to the insulating layer, by way of which a second via portion is configured in the region of the opening of the insulation layer, and a second surrounding layer portion, separated from the second via portion, is configured in the second layer. Provision is further made, with regard to the first and the second trench structure, to generate them in such a way that the first via portion of the first layer and the second surrounding layer portion of the second layer are disposed overlappingly with one another at least in a sub-region.

Such a method offers the possibility of manufacturing the component having the via in simple and economical fashion. Because high mechanical strength for the via can be achieved by way of the partial overlap of the first via portion and the second surrounding layer portion, conventional complex actions such as, in particular, filling a trench structure, can be dispensed with.

DETAILED DESCRIPTION OF THE INVENTION

Embodiments of components having vias, as well as methods for manufacturing them, are described with reference to the following Figures. The vias shown exhibit a high level of mechanical strength and can be manufactured simply and inexpensively. Processes known in semiconductor and microsystems engineering, for example complementary metal oxide semiconductor (CMOS) processes and microelectromechanical systems (MEMS) processes, can be carried out, and usual materials can be utilized, in the context of manufacture, so that these will be discussed only partially. Be it noted furthermore that the components depicted can encompass structures and structural elements in addition to those shown. In the same fashion, in the context of manufacture further method steps can be carried out alongside the processes depicted and described, in order to complete the manufacture of the components shown.

Figure 1:
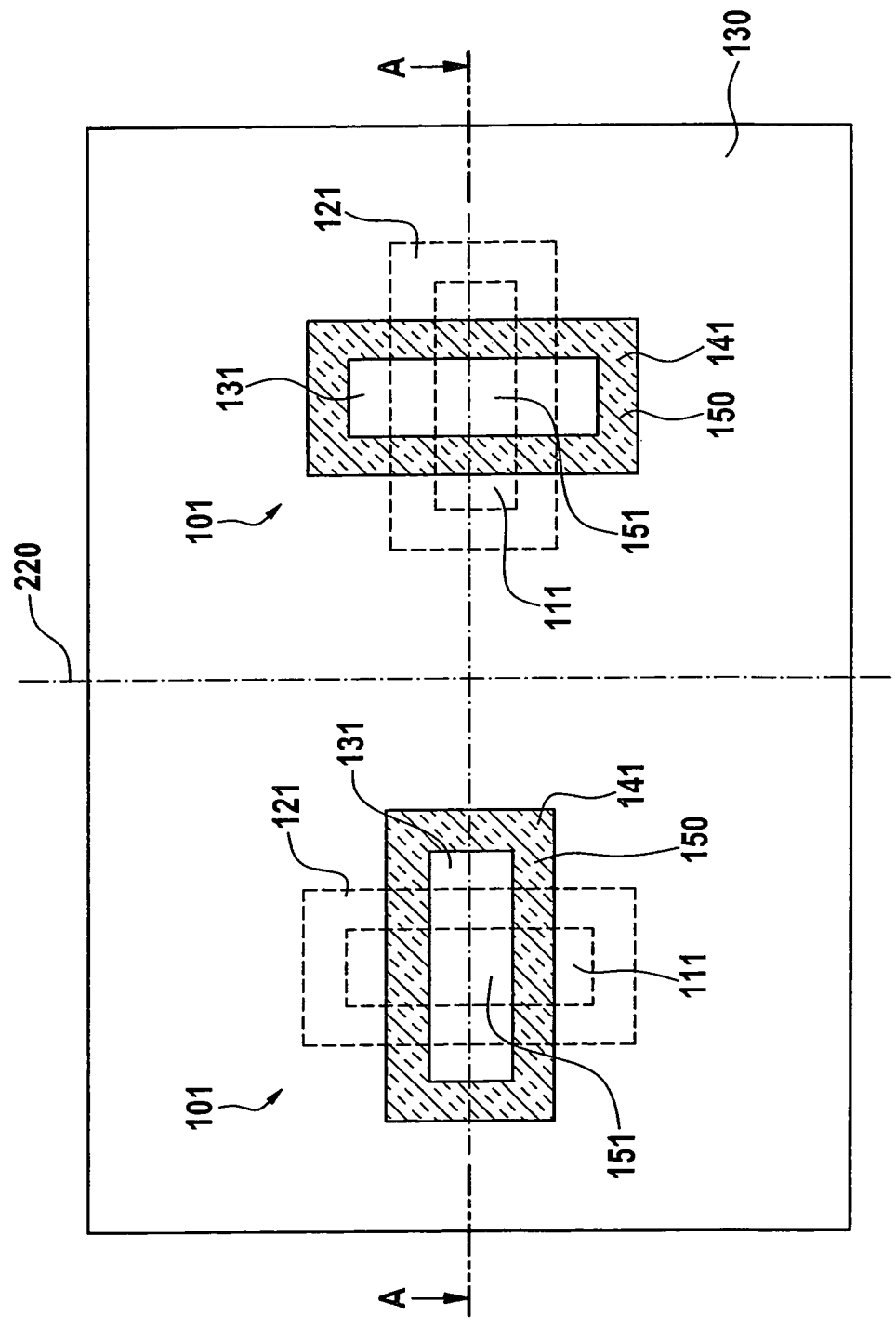
FIGS. 1 and 2 show a component having two vias, in each case in a schematic plan view and a schematic sectioned side view.

FIG. 1 is a schematic plan view of a component, or of sub-regions (divided by a dashed line 220) of a component, the component having two vias 101 (i.e. one via 101 per sub-region). A corresponding schematic sectioned side view of the component having the two sub-regions and vias 101 is presented in FIG. 2. The latter refers to the section line A-A indicated in FIG. 1.

The two vias 101 each have the same structure and, as is evident in particular with reference to the plan view of FIG. 1, are disposed with a right-angle rotation with respect to one another. This depiction of the component was selected for better illustration of the construction of vias 101. A comparable depiction may therefore also be found in the further FIGS. 3 to 15, which will be discussed later on. Be it noted in this context that instead of the rotated disposition of vias 101 that is shown, the possibility also exists of implementing two vias, or a number of vias, having the same orientation.

Figure 2:
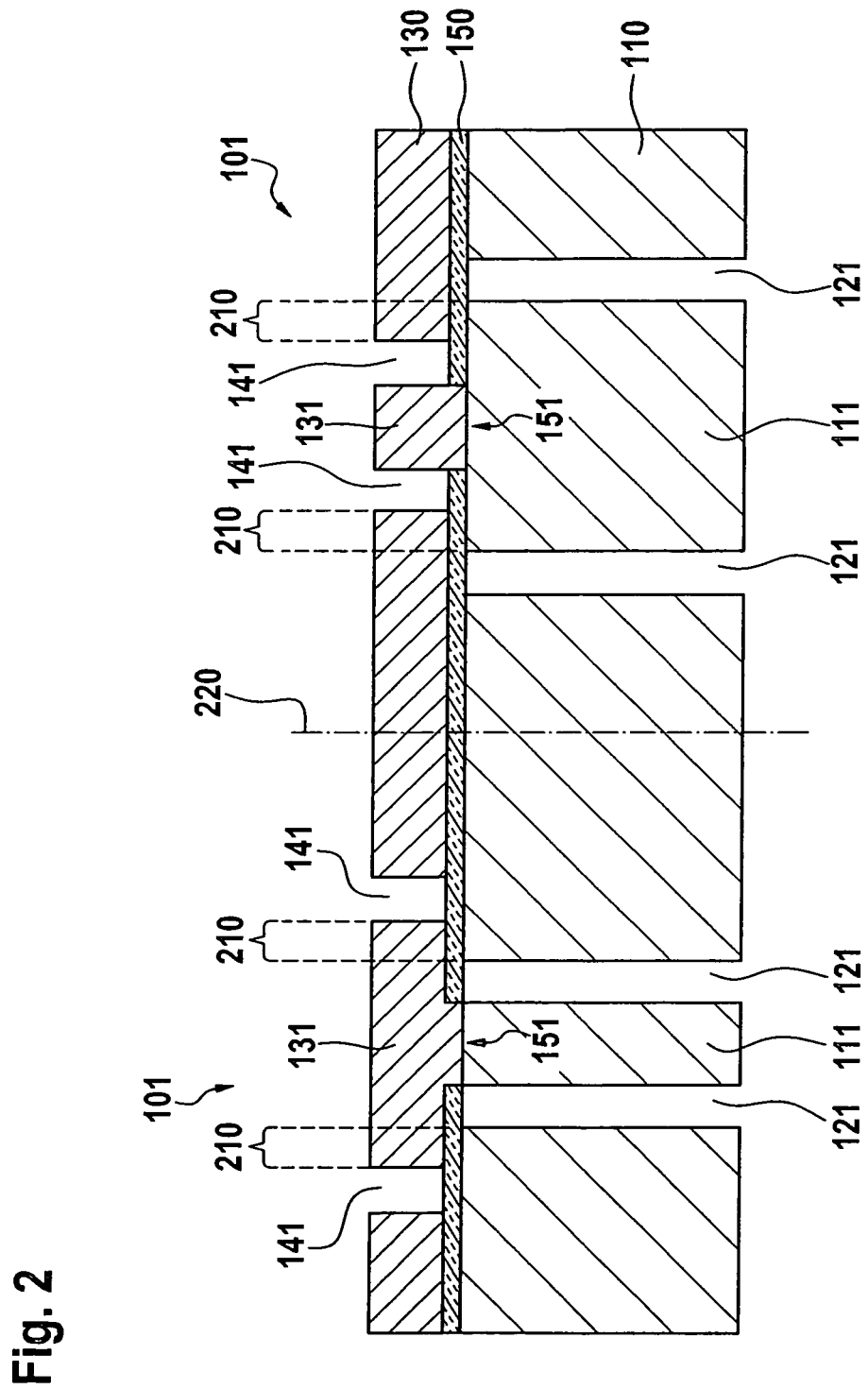

As is evident from FIG. 2, the component has a superimposed assemblage made up of a semiconductor substrate 110, an insulation layer 150 that is disposed and (partly) buried on semiconductor substrate 110, and a further layer 130 disposed (substantially) on insulation layer 150. Semiconductor substrate 110 can be, for example, a silicon substrate. Insulation layer 150 represents, for example, an oxide or silicon oxide layer ("buried oxide"). Layer 130, which can encompass further functional or sensor structures (not depicted) and is therefore also referred to hereinafter as "functional layer" 130, is e.g. a silicon layer generated using an epitaxy method. Substrate 110 and functional layer 130 can furthermore be embodied, at least in the region of vias 101, in (highly) doped fashion, so that vias 101 are low-resistance or possess high electrical conductivity.

The construction of one of vias 101 of the component will be further described below. Because the two vias 101 shown in FIGS. 1 and 2 each have the same structure, the following information applies both to via 101 located on the right and to the one on the left.

In the context of the component, via 101, or the conductive part of via 101, is (respectively) formed by a via portion 111 that is disposed in semiconductor substrate 110 and is rectangular in plan view, and by a via portion 131 that is configured in functional layer 130 and is rectangular in plan view. The lower via portion 111 is separated, by a trench structure 121 embodied in semiconductor substrate 110 and rectangularly frame-shaped in plan view, from the surrounding substrate 110 or a surrounding substrate portion. In the same fashion, upper via portion 131 is separated, by a trench structure 141 embodied in functional layer 130 and rectangularly frame-shaped in plan view, from the surrounding layer 130 or a surrounding layer portion. Trench structures 121, 141 thus serve for vertical insulation of via 101 or of via portions 111, 131 thereof.

In order to enable electrical connection of via portions 111, 131 to one another, insulation layer 150 has a (respective) opening 151 that is rectangular or square in cross section, so that via portions 111, 131 can directly adjoin one another at this location. In the exemplifying embodiment depicted in FIG. 2, opening 151 of insulation 150 is filled up only by via portion 131 of functional layer 130, and the relevant via portion 131 protrudes with a pertinent sub-portion into opening 151.

In the context of via 101, the rectangular via portions 111, 131 and trench structures 121, 141 embodied in substrate 110 and functional layer 130 can each have substantially the same contours or outside dimensions, as is also depicted in the plan view of FIG. 1. It is further evident from FIG. 1 that the rectangular via portion 111 and the pertinent trench structure 121 are aligned at right angles to via portion 131 disposed thereabove and the pertinent trench structure 141. In this fashion, the lower via portion 111 overlaps, at the ends or end regions, sub-regions (disposed thereabove) of the layer portion surrounding via portion 131. Corresponding overlap regions 210 for the via on the right are indicated in FIG. 2 for illustration. Conversely, the upper via portion 131 also overlaps, at the ends or end regions, sub-regions (disposed thereabove) of the substrate portion surrounding via portion 111. Corresponding overlap regions 210 for the via on the left are indicated in FIG. 2 for illustration.

In overlap regions 210 there exists in each case a permanent connection, created through insulation layer 150, between the lower or back-side via portion 111 and the layer portion surrounding the upper via portion 131, and between the upper or front-side via portion 131 and the substrate portion surrounding the lower via portion 111. In this regard, insulation layer 150 serves for vertical insulation of via portions 111, 131 of via 101.

The provision of this kind of partial or mutual overlap of portions of substrate 110 and of layer 130 ensures that via 101 is not suspended from or fastened to insulation layer 150 alone, and consequently possesses a high level of mechanical strength. Via 101 can therefore be exposed to a high level of mechanical stress, as can occur e.g. during wire bonding, with no risk of damage to or destruction of insulation layer 150 and therefore via 101.

One possible manufacturing process for the component shown in FIGS. 1 and 2 will be described in more detail below with reference to the schematic sectioned depictions of FIGS. 3 and 4 and the flow chart depicted in FIG. 24. In the method, in a step 201 a superimposed assemblage made up of a semiconductor substrate 110, a functional layer 130, and a buried insulation layer 150 disposed between semiconductor substrate 110 and functional layer 130 is generated. Insulation layer 150 is furthermore equipped with openings 151 (see FIG. 4).

Figure 3:
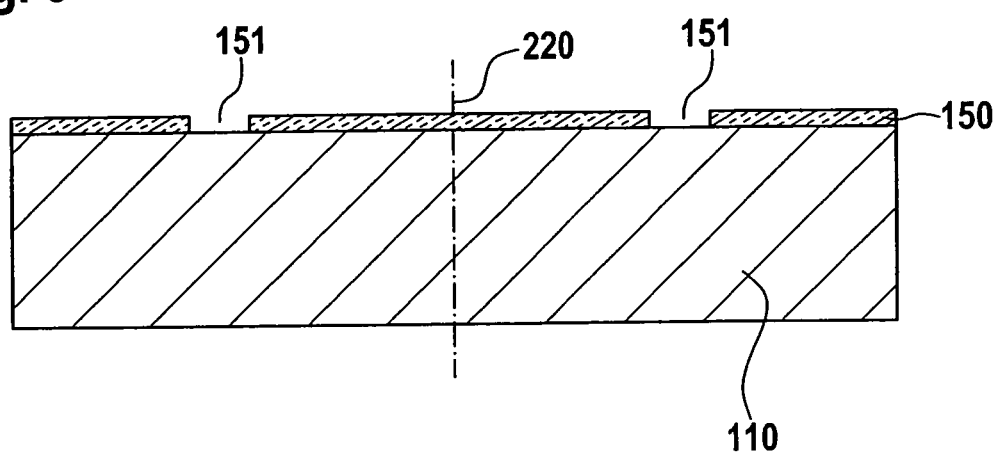
FIGS. 3 and 4 are sectioned side views of a substrate to illustrate steps that can be carried out upon manufacture of the component shown in FIGS. 1 and 2.

For this purpose, an insulation layer 150 is applied over the entire surface of prepared substrate 110 and, as depicted in FIG. 3, is subjected to patterning. As already described above, the prepared substrate 110, which can be a usual silicon wafer, can be doped at least in the region of the later vias 101. A usual deposition method can be carried out in order to apply insulation layer 150 onto substrate 110, and a usual photolithographic patterning and etching method can be carried out in order to pattern it. Patterning of the insulation layer causes the formation of openings 151 through which substrate 110 is exposed at these locations.

Figure 4:
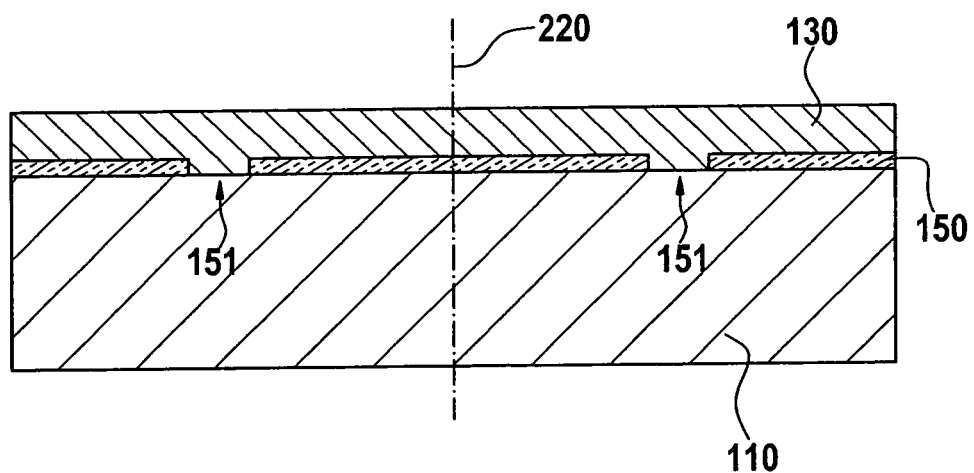

Also in the context of step 201, as depicted in FIG. 4, a functional layer 130 is applied over a large area onto the patterned insulation layer 150. The result is that openings 151 of insulation layer 150 are also filled up by the material of functional layer 130, so that functional layer 130 and semiconductor substrate 110 directly adjoin one another or are directly connected to one another at these locations. A usual deposition method can be carried out in order to form functional layer 130. In the case of a functional layer 130 encompassing silicon, an epitaxy method is especially suitable; the silicon can grow in monocrystalline fashion on substrate 110 in the region of openings 151, and in polycrystalline fashion on insulation layer 150. In addition, doping of layer 130 can be provided for during the epitaxy method in order to provide layer 130 with a higher electrical conductivity. Alternatively, it is also possible to carry out a doping or implantation doping process after functional layer 130 has been formed. In addition, a polishing process such as, for example, a chemical-mechanical polishing (CMP) process can be carried out in order to smooth functional layer 130.

In a subsequent method step 202, the enclosing trench structures 121, 141 shown in FIGS. 1 and 2 are generated in semiconductor substrate 110 and in functional layer 130, thus forming via portions 111, 131, which are respectively separated from the surrounding substrate 110 and surrounding layer 130, in the region of openings 151. Trench structures 121, 141 are thereby generated in such a way that the above-described mutual overlap of portions of substrate 110 and of layer 130 exists.

For this purpose, patterned masking layers ("trench masks" made, for example, of a photoresist material or an oxide material) are constituted on the front and back side, or on the front-side surface of functional layer 130 and on the back-side surface of substrate 110, and trench etching processes are carried out in order to form trench structures 121, 141. A deep reactive ion etching process, such as e.g. the so-called Bosch process, can be used for trench etching or "trenching." Insulation layer 150 can function in this context as an etch stop layer at which the respective trenching process is stopped. After trenching, the masking layers can be removed.

Further components having vias, and manufacturing methods for components, will be described with reference to the Figures that follow, depicting possible variations of the embodiment(s) described previously. Be it noted in this context that reference is made to the statements made previously with regard to details already described that refer to similar or corresponding components, usable manufacturing processes, possible advantages, etc.

Figure 5:
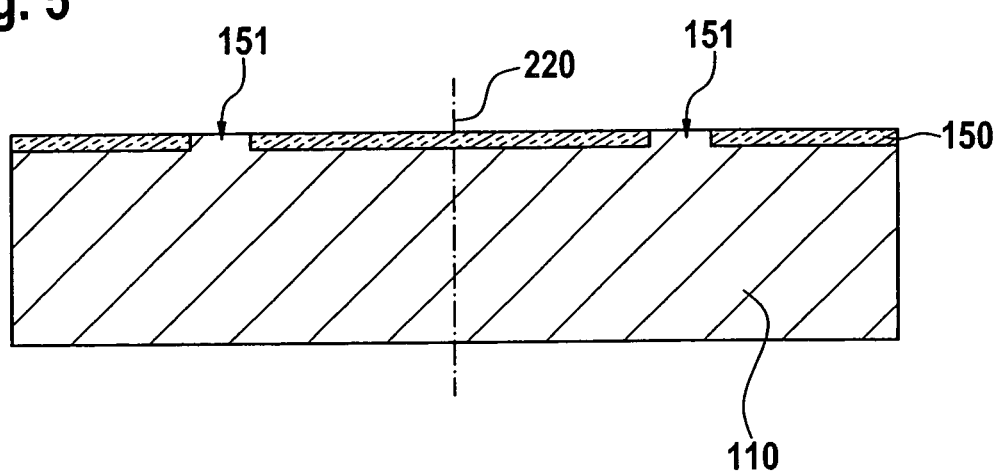
FIGS. 5 to 7 show the manufacture of a further component, in each case in a schematic sectioned side view.
Figure 6:
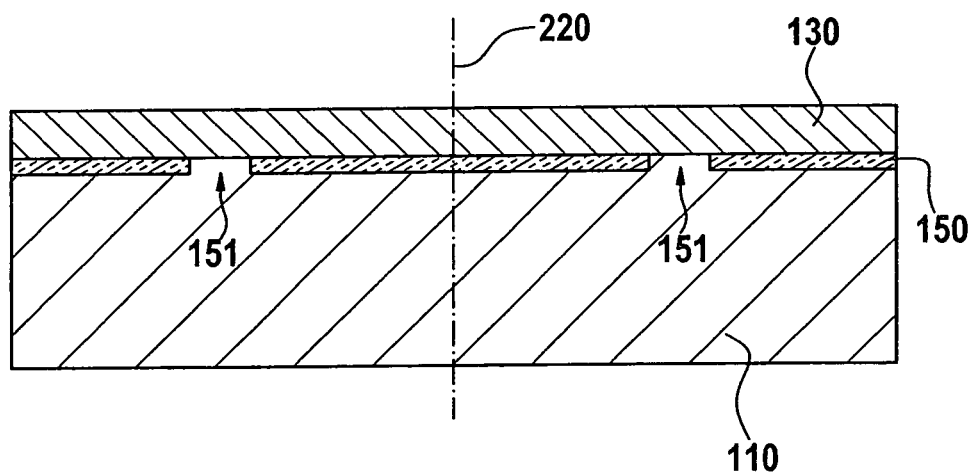
Figure 7:
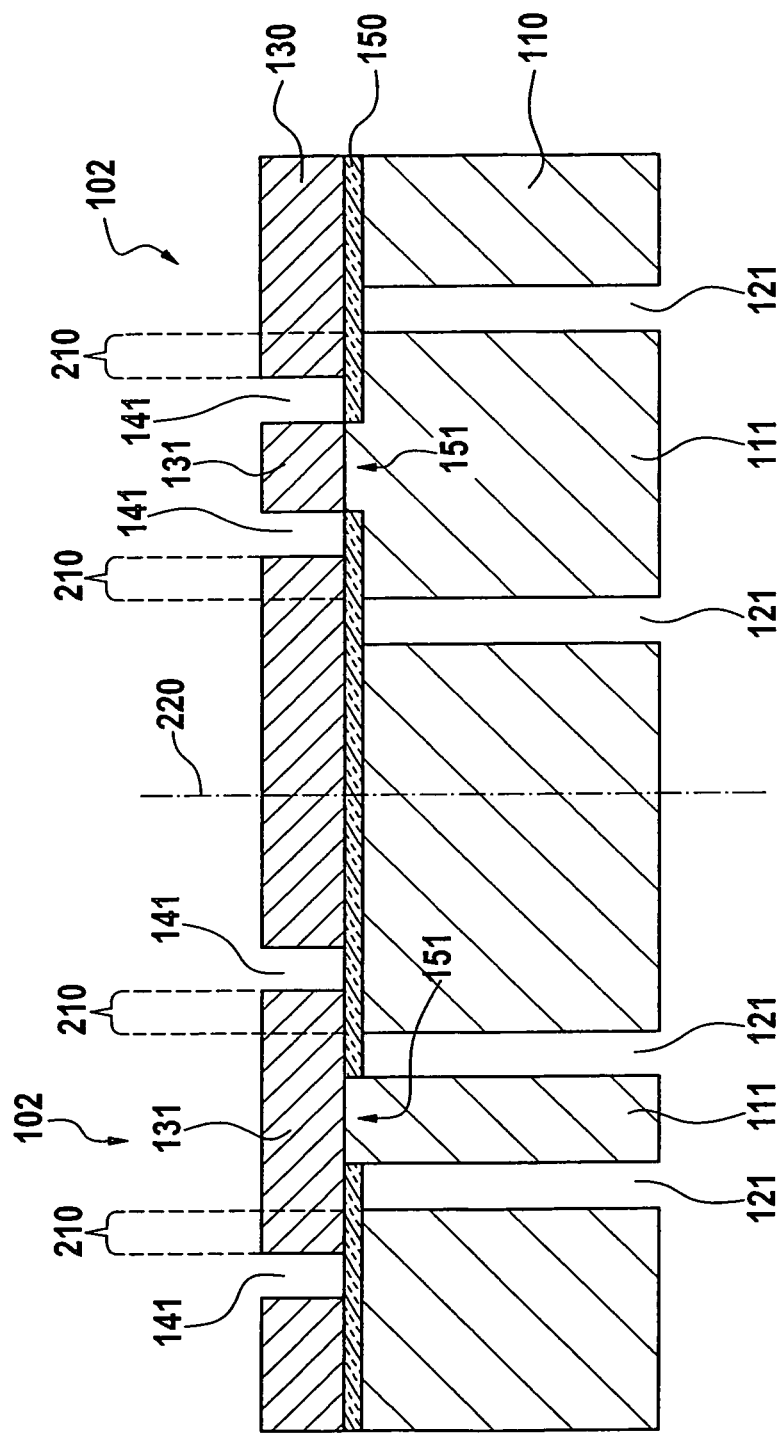
Figure 24:
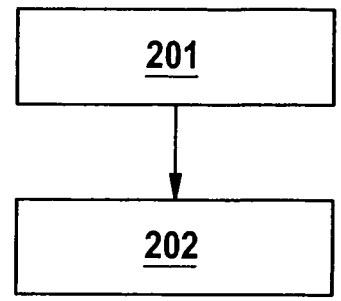
FIGS. 24 to 26 are flow charts of methods for manufacturing a component having a via.

FIGS. 5 to 7 show, each in a schematic sectioned side view, the manufacture of a further component having vias 102; once again, consideration may be given to the flow chart of FIG. 24. In the context of step 201, firstly semiconductor substrate 110 depicted in FIG. 5, having patterned insulation layer 150, is configured. Insulation layer 150 has openings 151 that are already filled up with material of substrate 110, so that substrate 110 together with insulation layer 150 forms a flat front-side surface.

In order to generate such a structure, substrate 110 can for example be masked in the region of the later openings 151 and a thermal oxidation can be carried out, thereby forming a patterned oxide layer or insulation layer 150. A polishing process, such as e.g. a CMP process, can then be carried out in order to remove the mask and generate the assemblage, depicted in FIG. 5, having a flat surface.

Further in the context of step 201, as depicted in FIG. 6, a functional layer 130 is applied over a large area onto the patterned insulation layer 150 and onto substrate 110 in the region of openings 151. A usual deposition method, for example an epitaxy method, can be carried out for this purpose. Alternatively, other known silicon-on-insulator (SOI) techniques can also be employed. In particular, the application of functional layer 130 can be carried out in the context of a bonding method (silicon direct bonding). In this context, functional layer 130 is formed on a further substrate; that further substrate having functional layer 130 is bonded by the action of temperature and pressure onto insulation layer 150 and substrate 110, and is then thinned down or removed by grinding and/or polishing.

In a subsequent method step 202, as depicted in FIG. 7, surrounding trench structures 121, 141 are generated in semiconductor substrate 110 and in functional layer 130, thus forming via portions 111, 131, which are respectively separated by trench structures 121, 141 from the surrounding substrate 110 and surrounding layer 130, in the region of openings 151. The processes referred to above (formation of trench masks and trenching) can once again be carried out for this purpose. Trench structures 121, 141 are generated in such a way that once again the mutual overlap of portions of substrate 110 and of layer 130 (including insulation layer 150) exists, as indicated in FIG. 7 by way of overlap regions 210. In plan view, the vias can have a geometry corresponding to FIG. 1.

In the exemplifying embodiment of FIG. 7, in contrast to the exemplifying embodiment of FIG. 2, openings 151 of insulation layer 150 are filled only by the lower via portions 111, and via portions 111 project into openings 151. This difference is caused by the differing configuration of the patterned insulation layer 150 on substrate 110 (see FIGS. 3 and 5). In the case of the components that are described with reference to the following Figures, a structure for vias 101 corresponding to FIG. 2 (i.e. upper via portions 131 project into openings 151) was selected. Be it noted in this context that alternatively, a structure for vias 102 corresponding to FIG. 7 (i.e. lower via portions 111 project into openings 151) can also be implemented. With regard to further details, reference is made to the statements made earlier.

Figure 8:
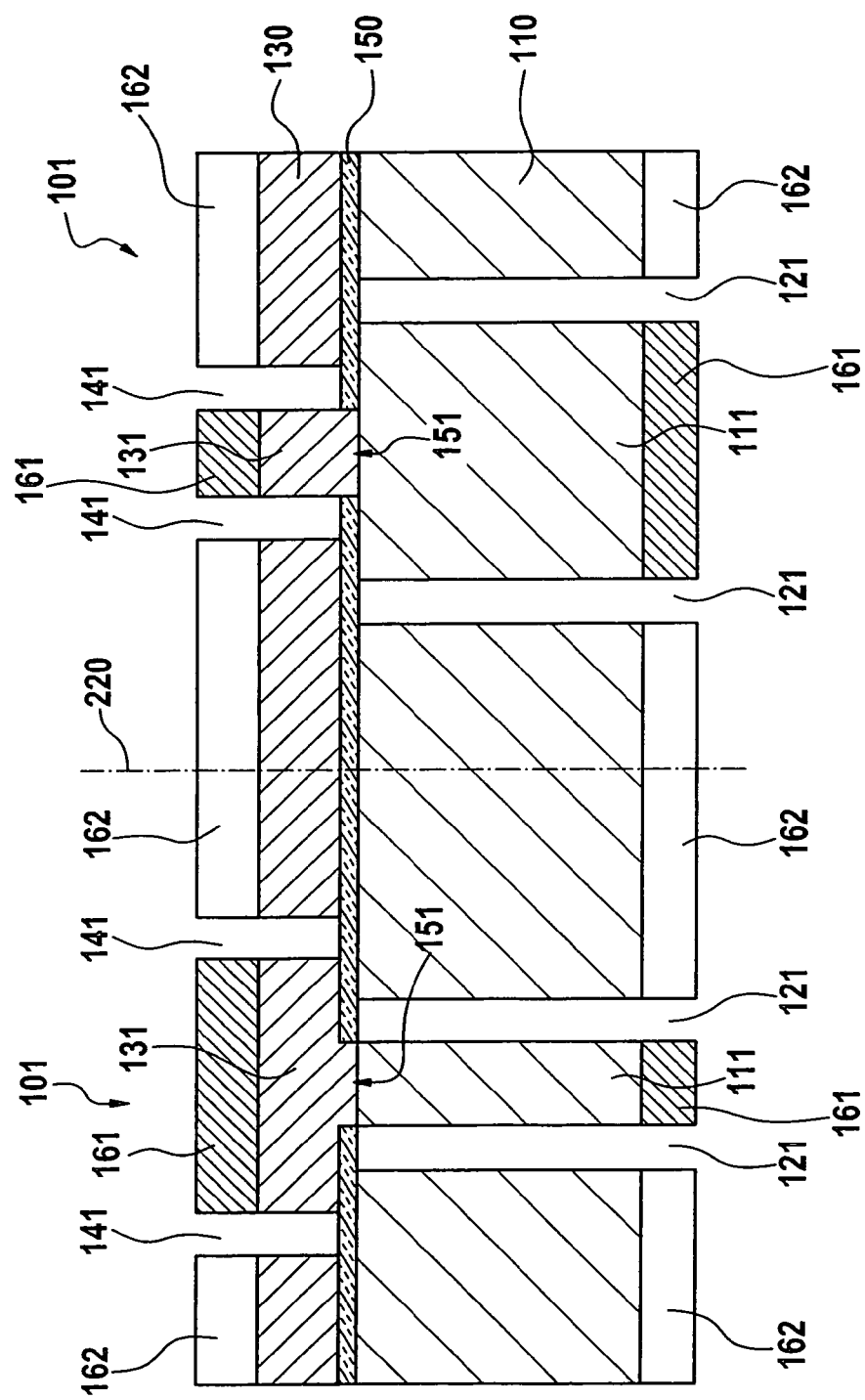
FIGS. 8 and 9 show the manufacture of a further component, in each case in a schematic sectioned side view.
Figure 9:
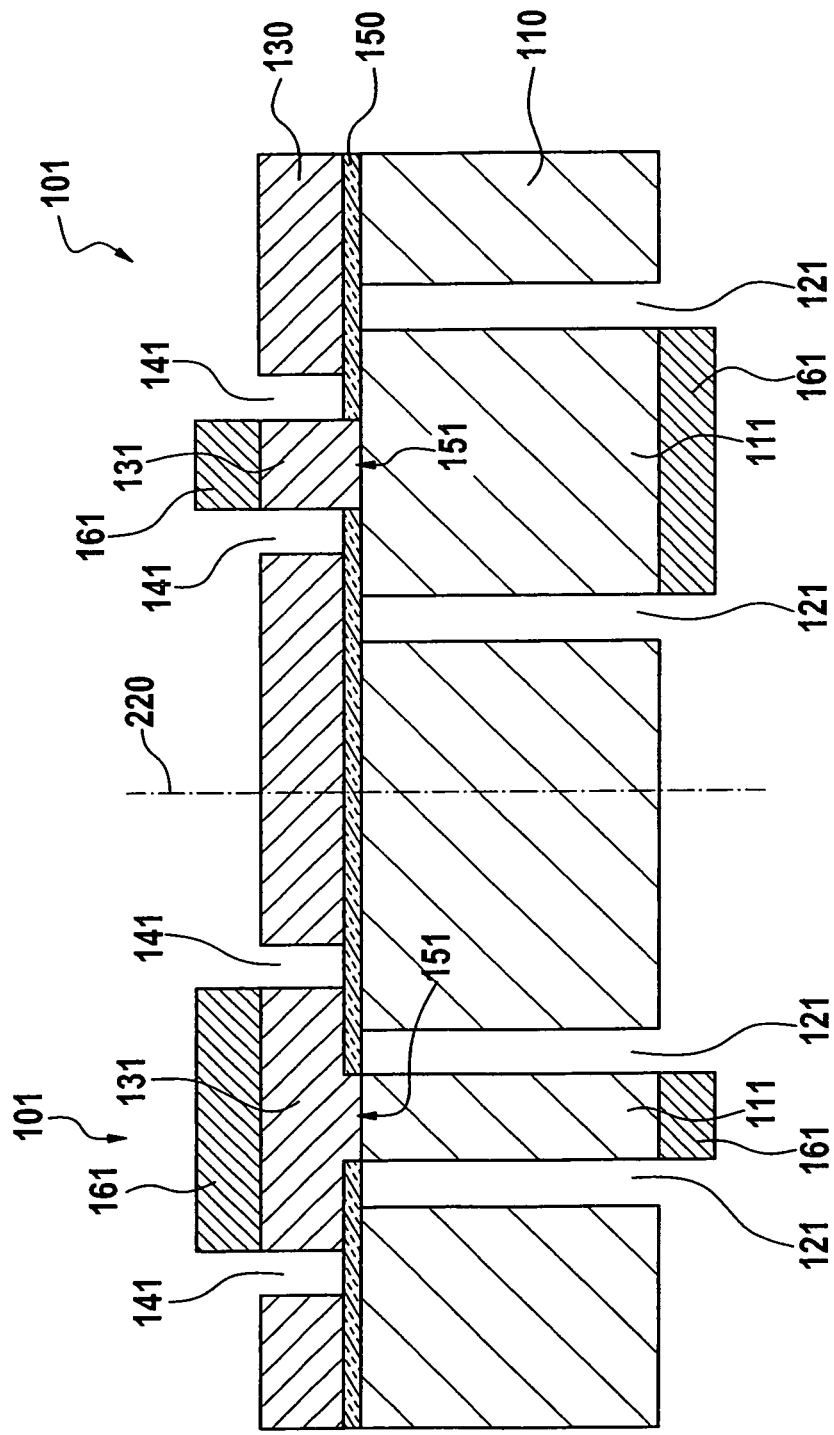
Figure 25:
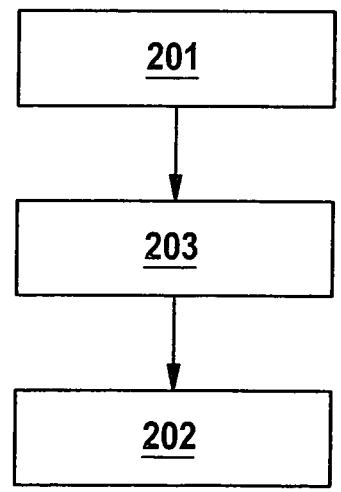

FIGS. 8 and 9 show, each in a schematic sectioned side view, the manufacture of a further component having vias 101. Pertinent steps of the manufacturing method are also summarized in the flow chart of FIG. 25. Here once again, in the context of a step 201 a superimposed assemblage made up of a semiconductor substrate 110, a functional layer 130, and a patterned insulation layer 150 disposed therebetween is made available (see FIG. 4). Before trench structures 121, 141 are formed, however (step 202), patterned metallic layers 161 are formed on the front and back side, or on the front-side surface of functional layer 130 and on the back-side surface of semiconductor substrate 110, in the context of a method step 203.

For this purpose, metallic layers 161 can firstly be applied respectively onto the entire surface of the front and back side. Possible materials for this are, for example, aluminum, gold, and platinum. Prior to the application of the metallic layers, provision can optionally also be made for the application of seed layers or adhesion layers that can also function as a diffusion barrier. Possible materials for this are, for example, titanium, titanium nitride, tantalum, or chromium. Metallic layers 161 on the front and back side are furthermore patterned, with the result that metallic layers 161, or portions thereof, remain behind only in the region of the later via portions 111, 132 (see FIG. 8).

Then, in the context of step 202, trench structures 121, 141 are generated in semiconductor substrate 110 and in functional layer 130 so that via portions 111, 131, which (as depicted in FIG. 8) are separated respectively from the surrounding substrate 110 and surrounding layer 130, are formed in the region of openings 151. For this, patterned masking layers 162 (made e.g. of a photoresist material or an oxide material) are formed on the front and back side between the portions of metallic layer 161, and trenching processes are carried out. In the trenching processes, both the patterned masking layers 162 and the patterned metallic layers 161 serve to mask substrate 110 and functional layer 130. Masking layers 162 can then furthermore, as depicted in FIG. 9, optionally be removed from substrate 110 and from functional layer 130.

In the context of the component manufactured according to this method, vias 101 on the front and back side are each equipped with a metallic layer or metallization 161. Metallization 161 forms a terminal surface or terminal pad with which reliable contacting of vias 101 or of the pertinent via portions 111, 131 to, for example, a bonding wire or a soldering means can be accomplished. The mutual overlap of portions of substrate 110 and of layer 130 provides sufficient mechanical strength for via 101 in particular with regard to attachment of a bonding wire.

Figure 26:
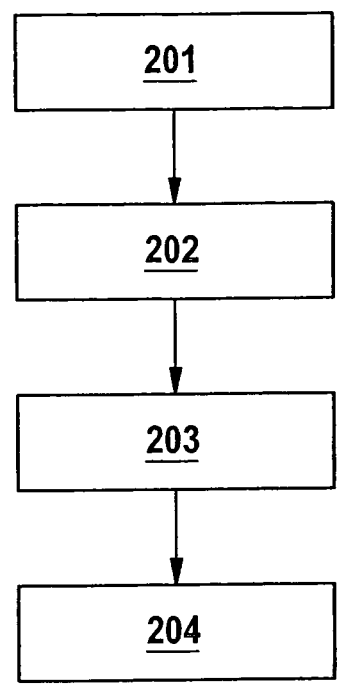

FIGS. 10 to 13 show, each in a schematic sectioned side view, the manufacture of a further component having vias 101. Pertinent steps of the manufacturing method are also summarized in the flow chart of FIG. 26.

The method again makes available, in the context of a step 201, a superimposed assemblage made up of a semiconductor substrate 110, a functional layer 130, and a patterned insulation layer 150 disposed therebetween (see FIG. 4). This is once again followed by a step 202 during which continuous trench structures 121, 141 are generated in semiconductor substrate 110 and in functional layer 130.

Figure 10:
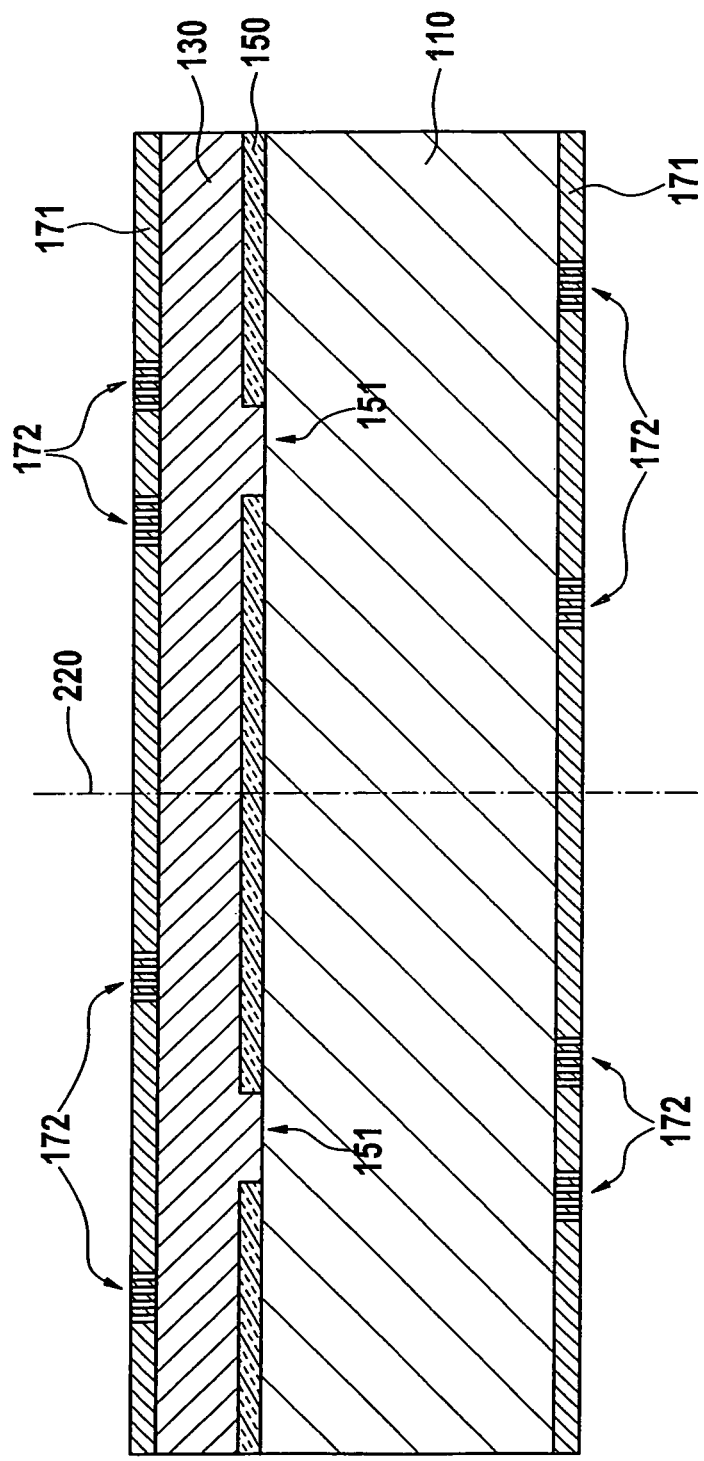
FIGS. 10 to 13 show the manufacture of a further component, in each case in a schematic sectioned side view.
Figure 11:
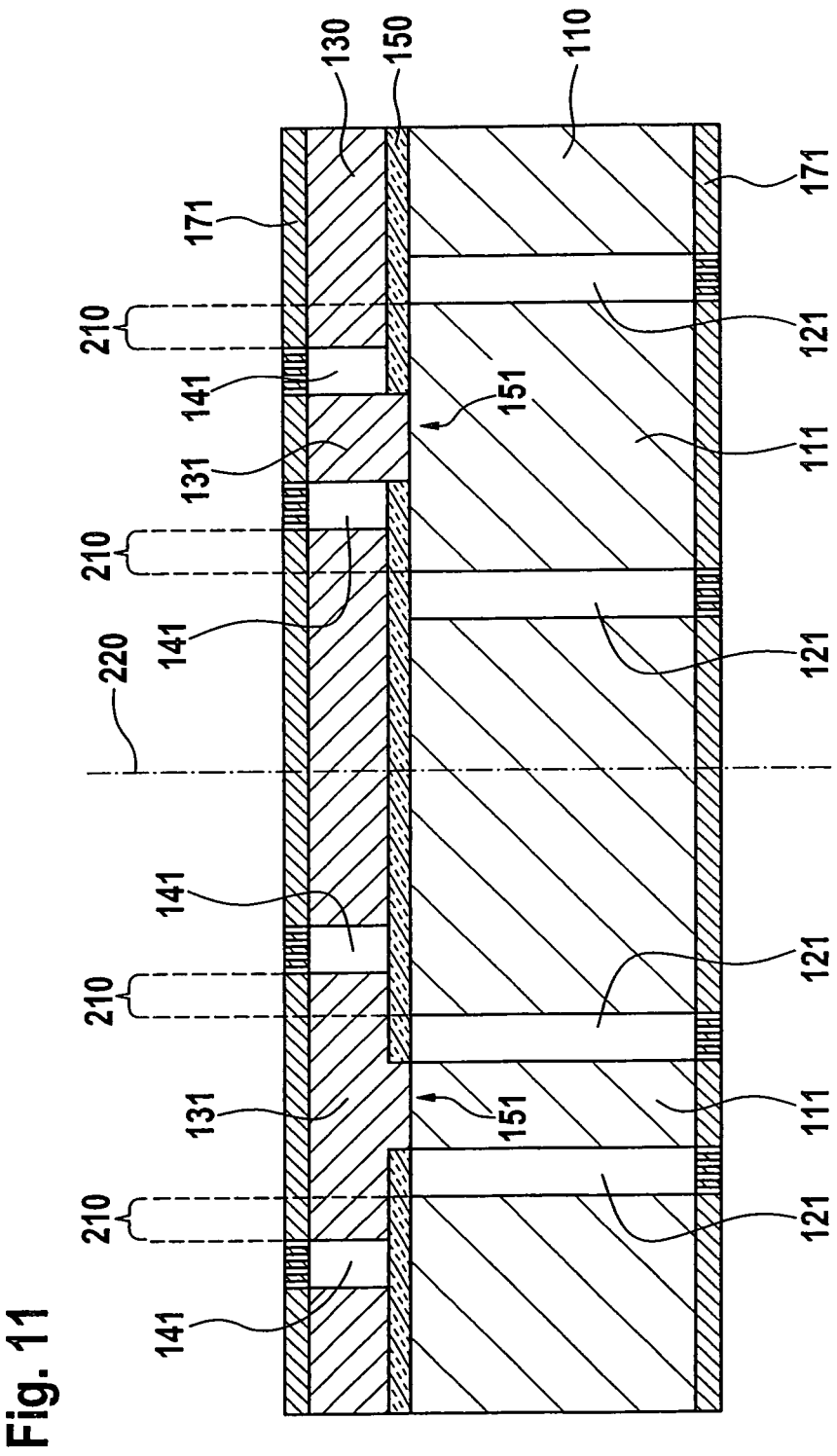

For this purpose, as depicted in FIG. 10, masking layers 171 are formed on the front and back side, or on the front-side surface of functional layer 130 and on the back-side surface of semiconductor substrate 110. Masking layers 171, which can be e.g. oxide layers, are further subjected to a (photolithographic) patterning process in order to form perforation regions 172. Perforation regions 172, which encompass a plurality of small holes, are selected so as to enable subsequent etching of substrate 110 and of functional layer 130 through the perforated masking layers 171, and thus the generation of trench structures 121, 141 as depicted in FIG. 11. Perforation regions 172 therefore have (in plan view) an enclosing or frame-like shape in order to define the continuous shape of trench structures 121, 141 and thus of via portions 111, 131 surrounded by trench structures 121, 141. Provision is once again made here to implement the mutual overlap of portions of substrate 110 and of layer 130, as indicated in FIG. 11 with reference to overlap regions 210. In plan view, via portions 111, 131 and trench structures 121, 141 have a geometry corresponding to FIG. 1.

Figure 12:
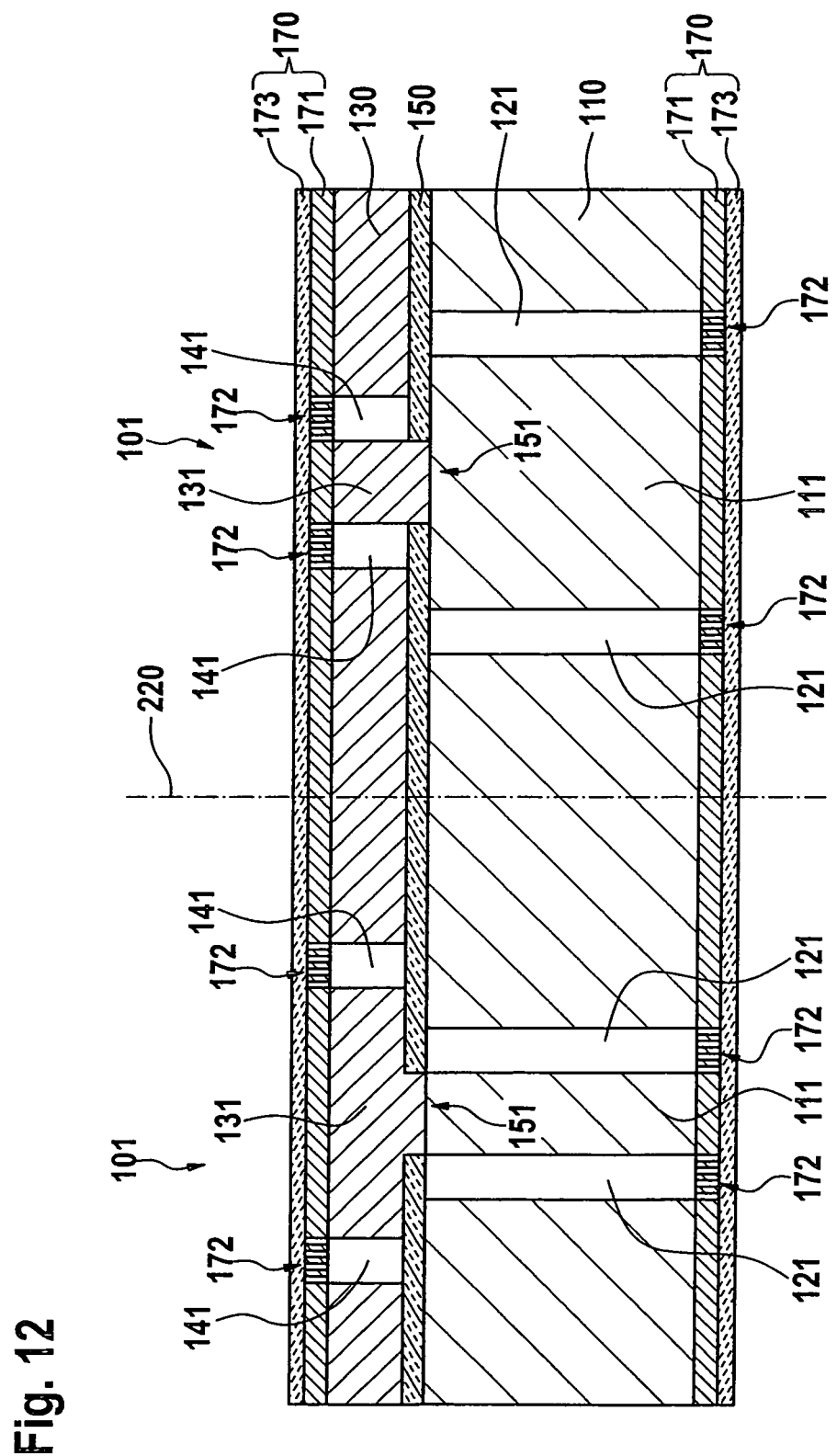

In the context of a further method step 203, a respective passivation layer 173 is applied onto the perforated masking layers 171 as depicted in FIG. 12. A nitride material or silicon nitride is suitable, for example, as a material for passivation layers 173. The two layers 171, 173 disposed on the front and back side together respectively form a sealing layer 170 with which trench structures 121, 141 are respectively sealed at perforation regions 172.

Penetration of dirt, particles, moisture, etc., as well as icing of trench structures 121, 141, can be prevented by the sealing or encapsulation of trench structures 121, 141. Deterioration of the electrical insulation of via portions 111, 131, or short-circuiting of via portions 111,131 to the respective surrounding substrate or layer portion, can thereby be avoided. The creation of mechanical stress (interference variable) as a result of such foreign materials, for example as a consequence of thermal expansion, swelling, etc., can also be prevented. In one possible embodiment of the component in the form of a sensor or actuator, good long-term stability can be achieved in this fashion, since drift (as a function of temperature, moisture) can be suppressed.

The provision of sealing layers 170 in order to encapsulate trench structures 121, 141 furthermore offers the possibility of configuring conductive traces and terminal surfaces which can be distributed arbitrarily on the pertinent component in the region of the front and back side. In contrast to the exemplifying embodiment shown in FIG. 9 having metallizations 161 disposed directly on via portions 111, 131, terminal structures can in this case be guided through sealing layers 170 and thus positioned as desired.

Figure 13:
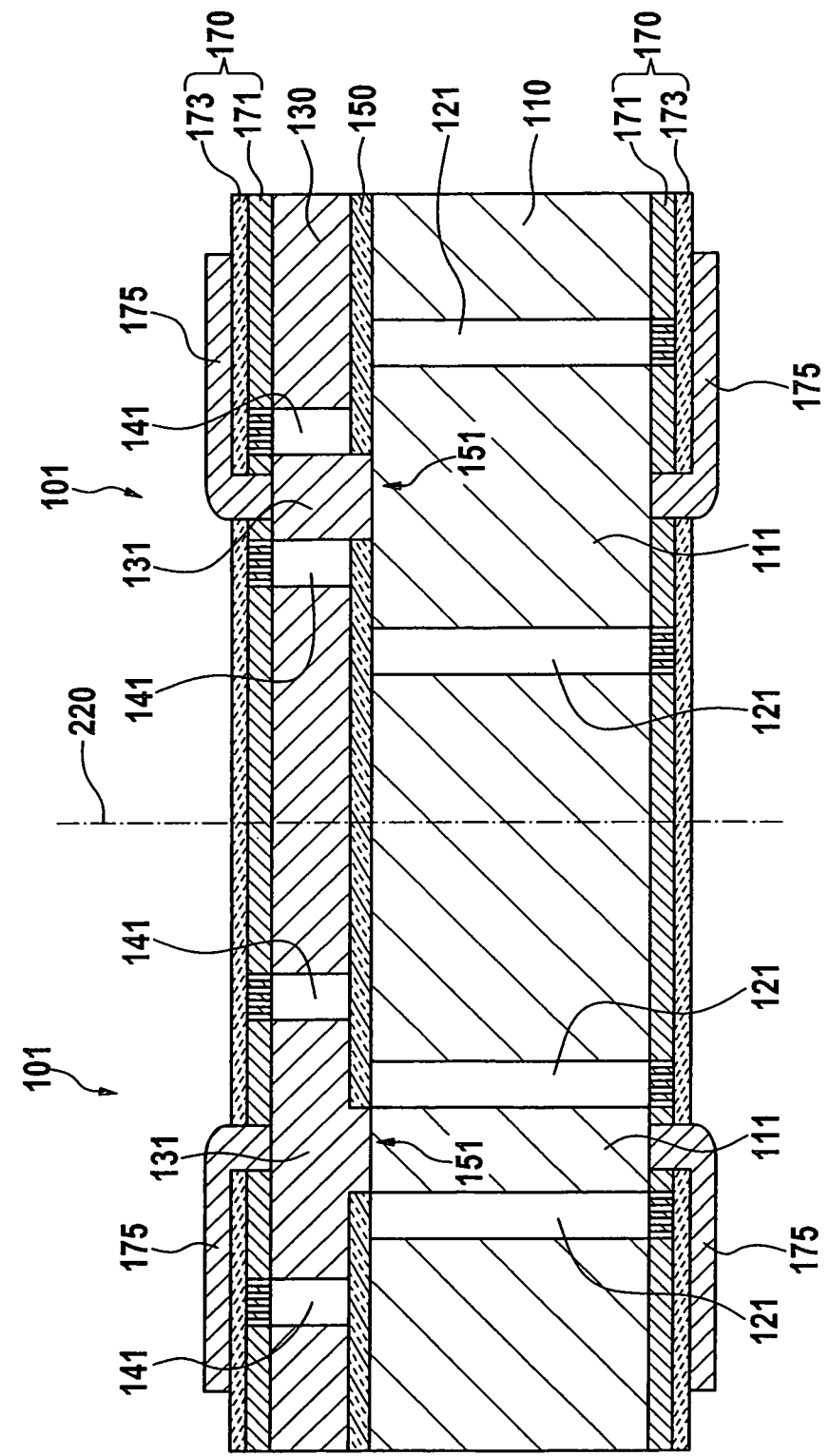

A possible embodiment is depicted in FIG. 13. For this, in the context of a further method step 204, the front- and back-side sealing layers 170, or sub-layers 171, 173 thereof, are opened in the region of via portions 111, 131, and (patterned) metallic layers 175 are formed on sealing layers 170 and the exposed regions of via portions 111, 131. Metallic layers 175 (or a sub-region thereof) can be embodied in the form of terminal surfaces by way of which via portions 111, 131 can be reliably contacted, for example, to a bonding wire or a soldering means.

The formation of metallic layers 161, 175 in accordance with the embodiments depicted in FIGS. 9 and 13 makes possible reliable contacting of the corresponding vias 101. Vias 101 can in this fashion be connected to further structures (for example sensor structures disposed in layer 130, integrated circuit structures, etc.) disposed on the same substrate 110 or component. It is also possible to connect vias 101 of one component to contact structures or terminal surfaces of other substrates or components, such that two or more components can be disposed vertically above one another. This makes possible a cost-effective construction and connection technology, in particular flip-chip assembly.

Instead of configuring metallic layers 161, 175 on both sides, i.e. on the front and back side, of a component, in accordance with the embodiments depicted in FIGS. 9 and 13, metallic layers 161, 175 of this kind can also be provided on only one of the two sides (front or back side). It is also possible to combine the exemplifying embodiments of FIGS. 9 and 13 with one another, i.e. to form metallizations 161 on one side and to provide sealing layers 170 and metallizations 175 on the other side.

When a sealing layer 170 is used, the possibility furthermore exists of configuring it additionally with a buried, electrically conductive sub-layer serving as a conductive trace or supply lead, which sub-layer adjoins a via portion in order to enable an electrical connection between the via portion and further structures. Such a configuration can be provided, for example, in the context of a sensor, in order to connect functional or sensor structures to a via.

Figure 14:
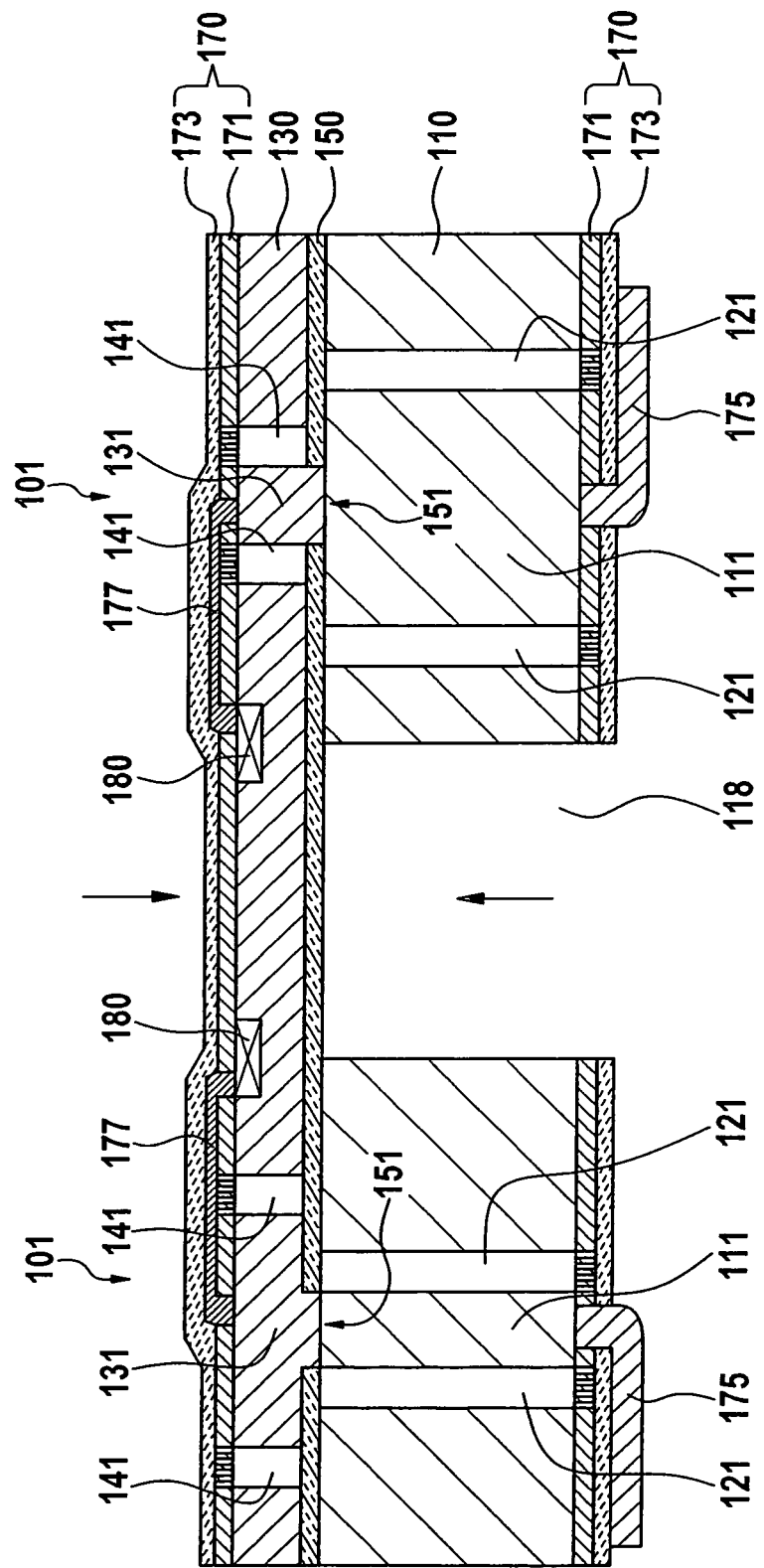
FIGS. 14 and 15 are schematic sectioned side views of pressure sensors having vias.

FIG. 14 shows, as an exemplifying illustration, a component embodied as a relative or differential pressure sensor, having two vias 101 that possess a structure similar to the component shown in FIG. 13 and can therefore be manufactured in a similar fashion using the approaches described above. The differential pressure sensor has, in a region between vias 101, a recess 118 extending as far as insulation layer 150, so that functional layer 130 (including sealing layer 170 located thereabove) can function in this region as a pressure-sensitive membrane. When different pressure levels are present on the sides of the membrane, as indicated in FIG. 14 with two arrows, the membrane can execute a corresponding excursion or deflection.

Recess 118 for the membrane can be manufactured with usual bulk micromechanical processes or MEMS processes such as, for example, trenching, KOH etching, etc. Here as well, insulation layer 150 can function as an etch stop layer.

In order to sense an excursion of the membrane and, based thereon, ascertain the differential pressure that is present, the differential pressure sensor has piezoresistive elements 180 embodied in (the upper side of) functional layer 130 at the edge of the membrane. Sealing layer 170 embodied on functional layer 130 further encompasses electrically conductive or metallic sub-layers 177. The conductive sub-layers 177, which are disposed in part on the perforated masking layer 171 and are covered by passivation layer 173, serve as supply leads through which piezoresistive elements 180 are connected to via portions 131 of vias 101. For this purpose, masking layer 171 is open both in the region of piezoresistive elements 180 and in the region of via portions 131, so that conductive sub-layers 177 can contact piezoresistive elements 180 and via portions 131. The differential pressure sensor has on the back side the structure known from FIG. 13, having the partly open sealing layer 170 that encompasses (only) the masking and passivation layers 171, 173, and having terminal surfaces 175 connected directly to via portions 111.

This configuration makes it possible for the differential pressure sensor, or sensor structures 180 thereof disposed on the front side, to be contacted from the back side. The differential pressure sensor can therefore, for example, be mounted on a further carrier substrate in the context of a flip-chip mounting process, terminal surfaces 175 being contacted by way of a soldering means or solder balls to corresponding terminal surfaces of said further carrier substrate. Vias 101 make it possible in this context to keep the freely accessible front side of the differential pressure sensor free of electrical leads or contacts. Because all the front-side contact and sensor structures are covered, the differential pressure sensor can have a high level of media resistance on the front side, i.e. a high level of resistance to constituents of a medium (pressure atmosphere) delivered to the front side.

Figure 15:
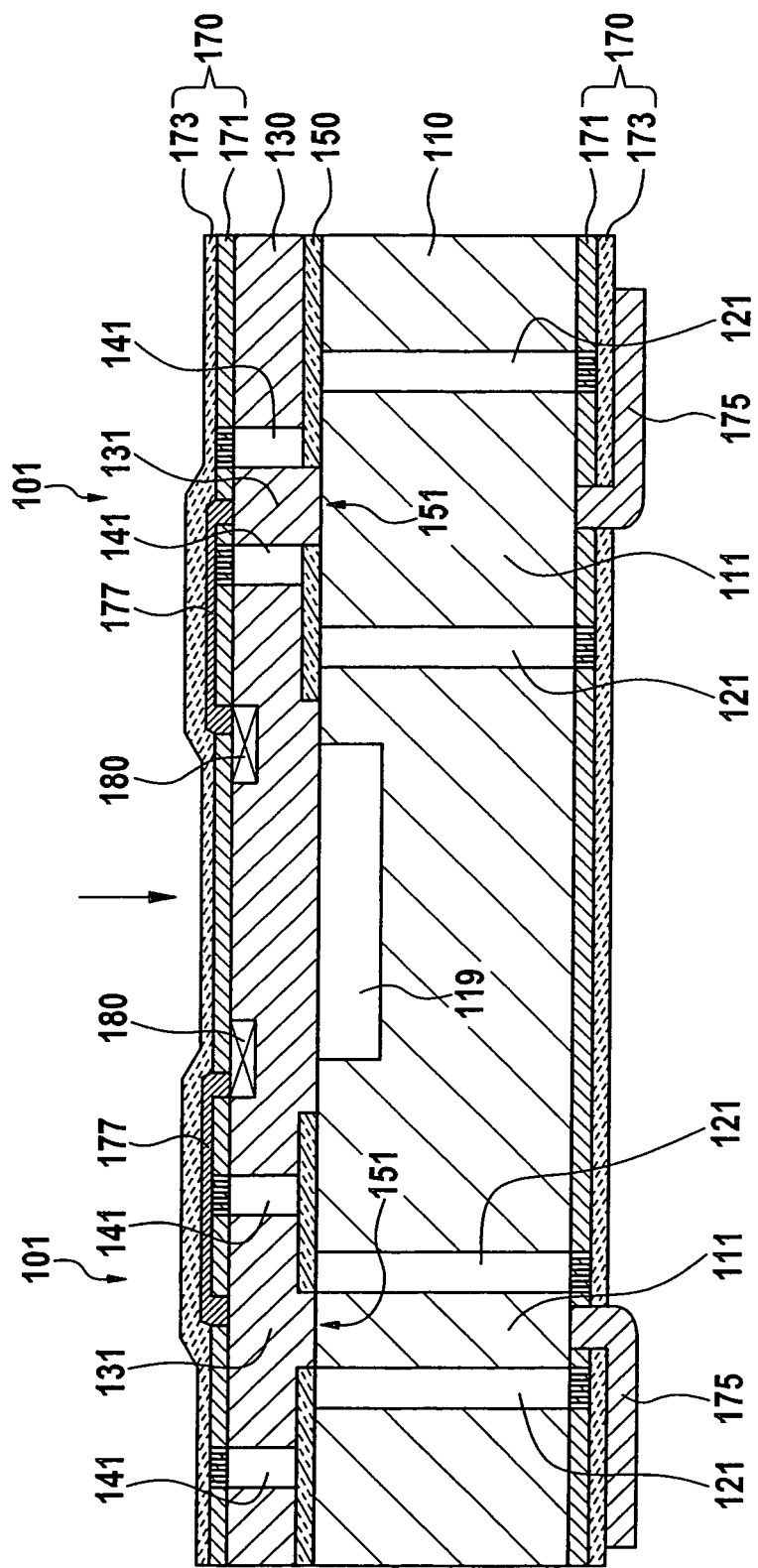

FIG. 15 is a schematic sectioned side view of a further component that is embodied as an absolute pressure sensor and possesses a construction comparable to the differential pressure sensor of FIG. 14. The absolute pressure sensor can also be manufactured using the approaches described above.

In contrast to the differential pressure sensor, however, the absolute pressure sensor of FIG. 15 has not a recess 118 but instead a closed cavity 119 embodied in semiconductor substrate 110 between the two vias 101. As a result, functional layer 130 (including sealing layer 170 located thereabove) can once again function in this region as a pressure-sensitive membrane, a pressure present in cavity 119 serving as a reference pressure. When a pressure is applied against the front side of the membrane (indicated in FIG. 15 by way of an arrow), the membrane can therefore execute a corresponding excursion or deflection that can be sensed by way of piezoresistive elements 180 provided in functional layer 130 at the edge of the membrane.

Cavity 119 can be manufactured, for example, in the context of a so-called advanced porous silicon membrane (APSM) process in which pores are first generated in substrate 110 and then "combine" under the action of temperature to form cavity 119. The temperature effect can be exerted, in particular, upon application of functional layer 130 onto substrate 110, in which context an epitaxy method can be carried out as described above.

The absolute pressure sensor of FIG. 15 is furthermore embodied in such a way that insulation layer 150 is removed not only in the region of via portions 111, 131 and at openings 151, but also in the region of cavity 119 and the membrane. When an epitaxy method is carried out in order to form a silicon functional layer 130, it is thereby possible to cause the silicon to grow in monocrystalline fashion in the membrane region as well, with the result that the membrane possesses a high level of strength and piezoresistors 180 are highly insensitive to stress.

Analogously with the differential pressure sensor of FIG. 14, back-side contacting is also possible with the absolute pressure sensor of FIG. 15, and the covered configuration of the supply leads 177 disposed on the front side under the completely continuous passivation offers the advantage of high media resistance. In addition, the absolute pressure sensor can be relatively highly insensitive to overpressure and can be notable for a high burst pressure, since the membrane that is deflected at high absolute pressures can be braced against the inner side of cavity 119 located opposite the membrane.

As a result of the covered contact structures on the front side, the pressure sensors of FIGS. 14 and 15 are particularly suitable for applications that require particular media resistance. This includes, for example, pressure sensors used in motor vehicles. Possible examples are a barometric air pressure (BAP) sensor, a manifold air pressure (MAP) sensor, a diesel particle filter (DPF) pressure sensor, a fuel pressure sensor, a tank pressure sensor, a transmission pressure sensor, a sensor for an air conditioning system, etc.

In addition, it is noted that the configuration of components using the approaches described here and the vias that are shown is not limited only to piezoresistive pressure sensors, but can also be used correspondingly in the context of other components. This applies, for example, to capacitive sensor elements and pressure sensors in which a deflection of a membrane is sensed in capacitive fashion. Further examples are other sensors or actuators such as, for example, micromechanical acceleration or rotation-rate sensors, infrared (IR) sensors or IR arrays, Hall sensors, micromirrors, etc. The vias can in this context once again offer advantages such as, in particular, enabling back-side contacting, the functional structures, sensor structures, and/or circuit structures of such components being provided in the region of a front side.

With regard to the vias, the possibility furthermore exists of generating them with different geometries and structures, such that the above-described processes can likewise be carried out in order for manufacturing purposes. Possible exemplifying embodiments of further vias 103 to 108, which are embodied on a superimposed assemblage of a semiconductor substrate 110, an insulation layer 150, and a functional layer 130, and in which once again a partial connection of overlapping portions of semiconductor substrate 110 and of functional layer 130 by way of insulation layer 150 exists in order to achieve a high level of mechanical strength, are depicted in FIGS. 16 to 23.

Figure 16:
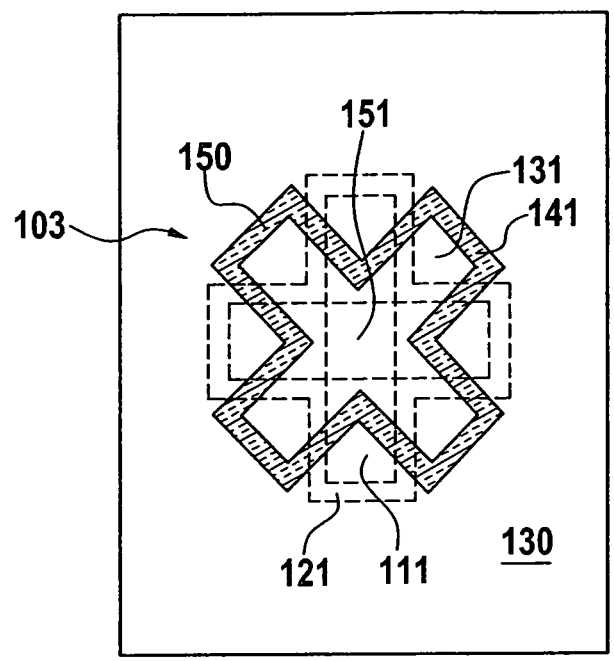
FIGS. 16 to 19 are schematic plan views of components having further vias.

FIG. 16 is a plan view showing a further via 103 having a via portion 111 embodied in semiconductor substrate 110 and having a via portion 131 embodied in a functional layer 130, (both of) which have a cross-shaped geometry and are surrounded by trench structures 121, 141 extending in cross-shaped fashion. Via portions 111, 131 are connected directly to one another at a, for example, square opening 151 of insulation layer 150. With a double-cross-shaped configuration of this kind, via portions 111, 131 are aligned with a 45-degree rotation with respect to one another, so that the ends or "crossbar ends" thereof are respectively linked (vertically by way of insulation layer 150) to layer 130 surrounding portion 131 and to substrate 110 surrounding portion 111.

Figure 17:
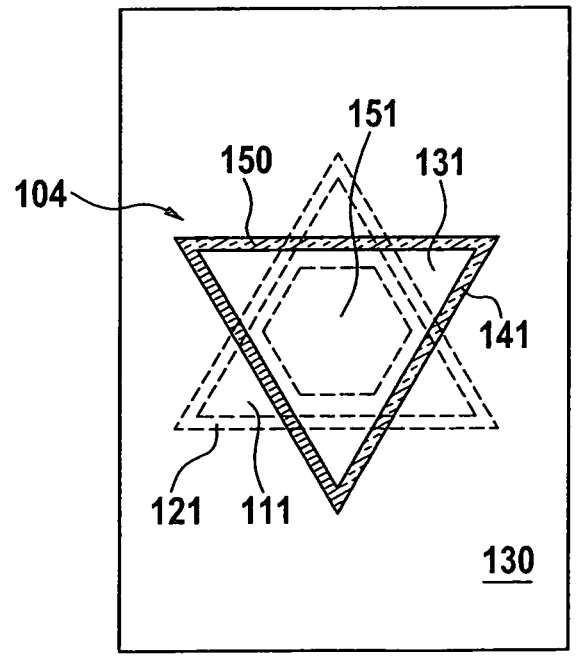

FIG. 17 shows a further possible configuration of a via 104 having a via portion 111 embodied in semiconductor substrate 110 and a via portion 131 embodied in functional layer 130, (both of) which have a triangular geometry and are surrounded by trench structures 121, 141 extending in triangular fashion. Via portions 111, 131 are connected directly to one another at a, for example, hexagonal opening 151 of insulation layer 150. Via portions 111, 131 are moreover oriented mirror-symmetrically with respect to one another, so that the ends or "vertices" thereof are respectively linked (vertically by way of insulation layer 150) to layer 130 surrounding portion 131 and to substrate 110 surrounding portion 111.

Figure 18:
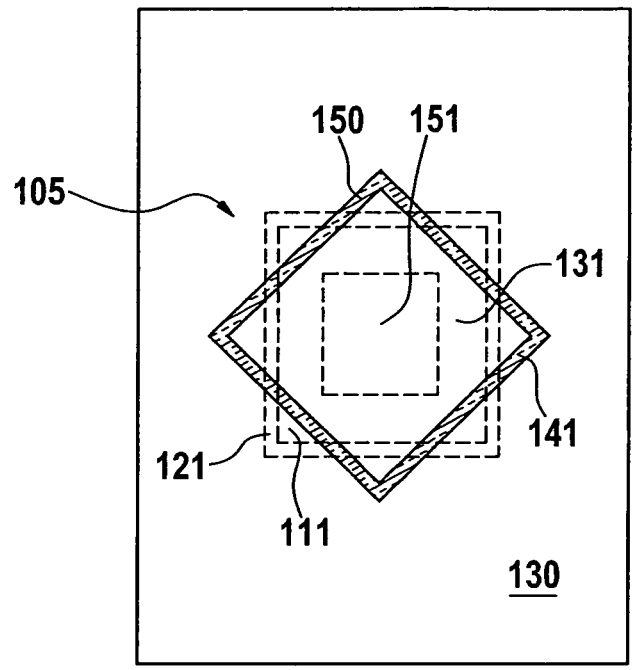

FIG. 18 shows a further possible configuration of a via 105 having a square via portion ill embodied in semiconductor substrate 110 and a square via portion 131 embodied in functional layer 130, which are surrounded by trench structures 121, 141 extending in square fashion. Via portions 111, 131 are connected directly to one another at a, for example, square opening 151 of insulation layer 150. With a double-square disposition of this kind, via portions 111, 131 are aligned with a 45-degree rotation with respect to one another, so that the ends or "vertices" thereof are respectively linked (vertically by way of insulation layer 150) to layer 130 surrounding portion 131 and to substrate 110 surrounding portion 111.

Figure 19:
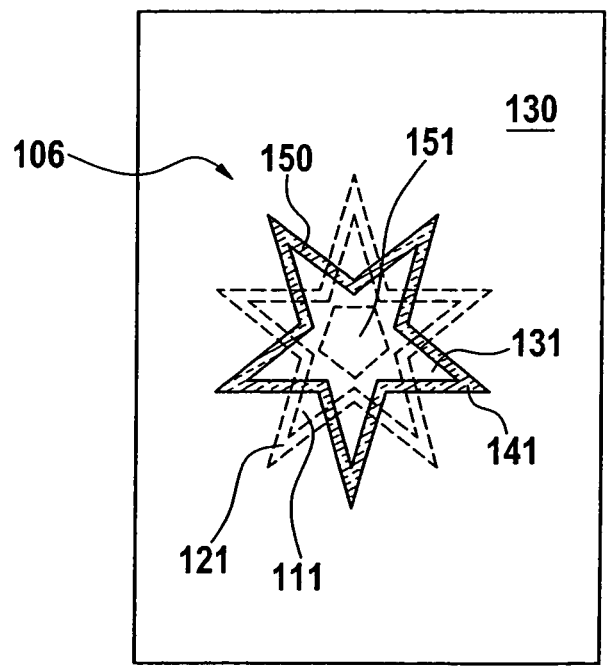

FIG. 19 shows a further possible configuration of a via 106 having a star-shaped via portion 111 embodied in semiconductor substrate 110 and a star-shaped via portion 131 embodied in functional layer 130, which are surrounded by star-shaped trench structures 121, 141. Via portions 111, 131 are connected directly to one another at a, for example, pentagonal opening 151 of insulation layer 150. With a configuration of this kind, via portions 111, 131 are aligned with an offset from one another, so that the ends or "vertices" thereof are respectively linked (vertically by way of insulation layer 150) to layer 130 surrounding portion 131 and to substrate 110 surrounding portion 111.

The vias 101 to 106 described and depicted above are embodied in such a way that a mutual overlap of portions of semiconductor substrate 110 and of functional layer 130 exists. Alternatively, however, it is also possible to implement vias in which only a "one-sided" overlap exists, as will be described in further detail with reference to the exemplifying embodiments that follow.

Figure 20:
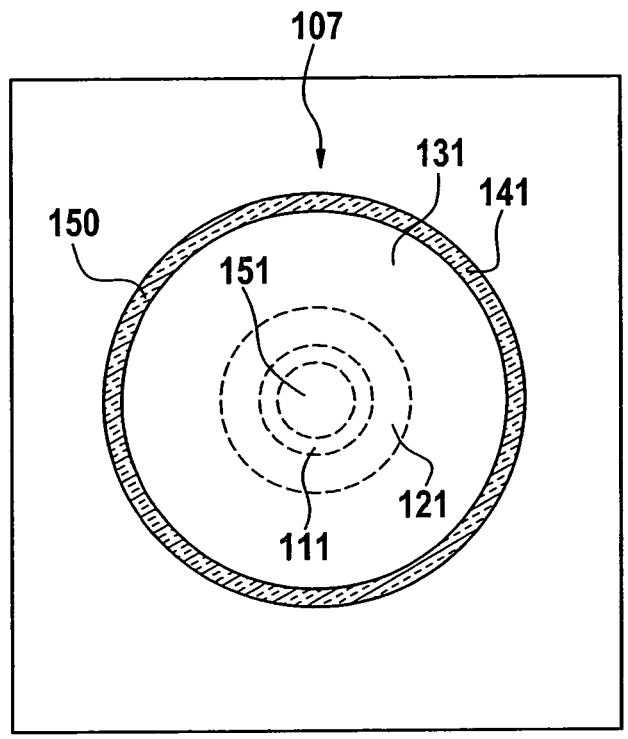
FIGS. 20 and 21 show a further component having a via, in each case in a schematic plan view and a schematic sectioned side view.
Figure 21:
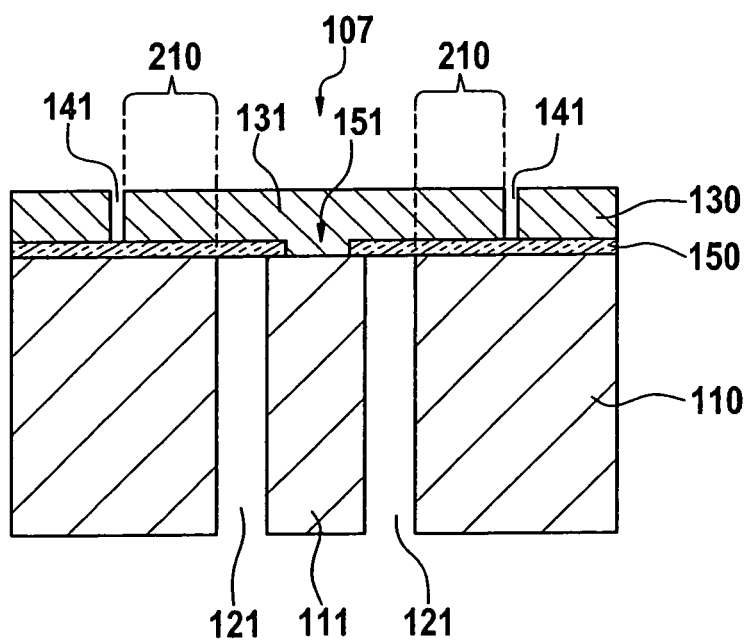

FIGS. 20 and 21 show, in a schematic plan view and a schematic sectioned side view, a further exemplifying embodiment of a via 107. The latter encompasses a via portion 111 embodied in semiconductor substrate 110, and a via portion 131 embodied in functional layer 130, (both of) which have a circular geometry with a different radius and are surrounded by trench structures 121, 141 extending in a circular shape. Via portions 111, 131 are directly connected to one another at a likewise circular opening 151 of insulation layer 150. In this configuration, only via portion 131, or its edge, is overlapping with respect to a substrate portion surrounding via portion 111. In accordance with the geometry of via portions 111, 131 and trench structures 121, 141, the pertinent overlap region 210 here possesses a circularly peripheral or annular shape.

Figure 22:
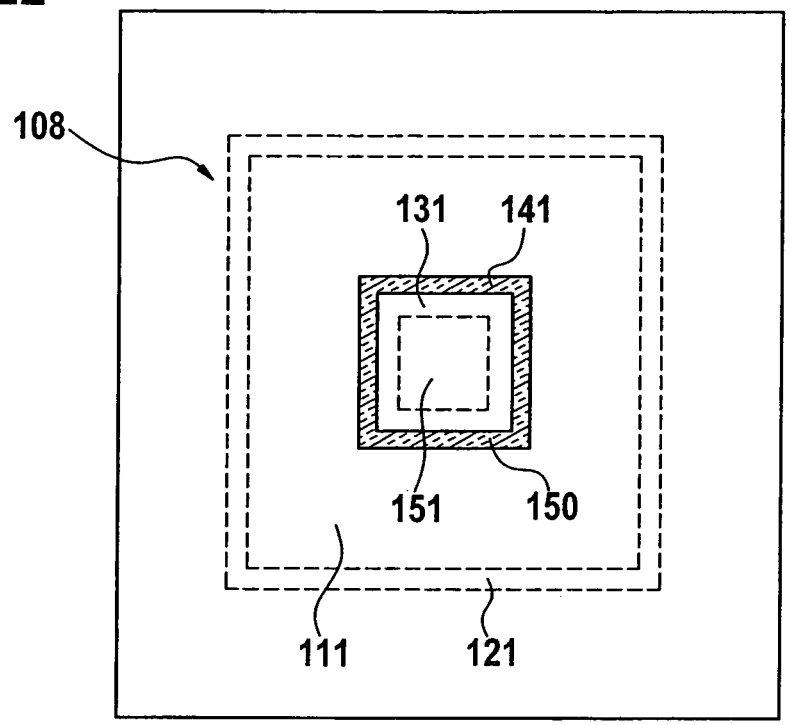
FIGS. 22 and 23 show a further component having a via, in each case in a schematic plan view and a schematic sectioned side view.
Figure 23:
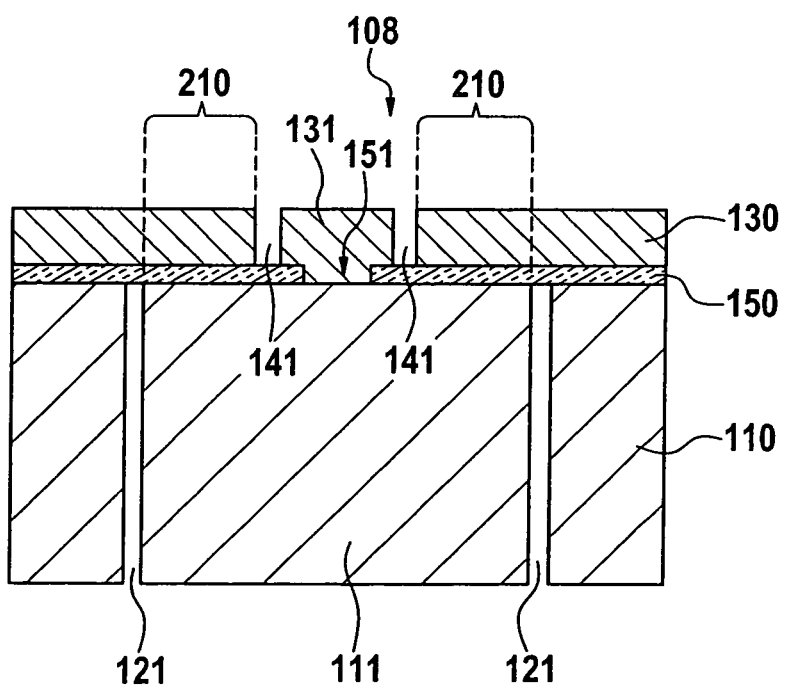

FIGS. 22 and 23 show, in a schematic plan view and a schematic sectioned side view, a further exemplifying embodiment of a via 108. The latter encompasses a via portion 111 embodied in semiconductor substrate 110, and a via portion 131 embodied in functional layer 130, (both of) which have a square geometry having different dimensions and are surrounded by trench structures 121, 141 extending in square fashion. Via portions 111, 131 are directly connected to one another at a likewise square opening 151 of insulation layer 150. In this configuration, only via portion 111, or its edge, is overlapping with respect to a layer portion surrounding via portion 131. In accordance with the geometry of via portions 111, 131 and trench structures 121, 141, the pertinent overlap region 210 here possesses a frame-like shape extending in square fashion.

The embodiments explained with reference to the Figures represent preferred and exemplifying embodiments of the invention. Further embodiments that can encompass further variations, or even combinations of features described, are conceivable instead of the embodiments described.

For example, the configurations described with reference to vias 101 (for example, provision of a metallization 161, sealing with a sealing layer 170, etc.) can also be implemented in the context of the other vias 102 to 108. A further possible variant involves implementing via 107 shown in FIGS. 20, 21, for example, with square dimensions in accordance with via 108 of FIGS. 22, 23. Conversely, via 108 shown in FIGS. 22, 23 can also, for example, be embodied with circular dimensions in accordance with via 107 of FIGS. 20, 21.

With regard to materials that have been recited, the possibility exists, for example, of replacing them with other materials. Other substrates having a different construction or different structures can also be made available and/or can be used with a semiconductor material other than silicon, in which one or more vias can be embodied using the approaches described above.

Processes in addition to those described can moreover be carried out, and/or further elements and structures (functional structures, sensor structures, circuit structures, etc.) can be constituted. Further processes include, for example, a singulating process allowing a component that is generated together with other components on a substrate or wafer 110 to be separated or singulated from the other components.

It is also possible to implement a component, having vias, in which a semiconductor circuit is integrated instead of or in addition to a sensor or sensor structures (e.g. the sensors of FIGS. 14 and 15). The semiconductor circuit can be, for example, an evaluation circuit for the sensor. The possibility exists in the this context of integrating the evaluation circuit on the same substrate or chip as the sensor.

Alternatively, it is possible to embody an evaluation circuit for a sensor (in particular a sensor having the above-described vias, for example the sensors of FIGS. 14 and 15) in the form of a separate component or chip having vias in accordance with the approaches described above, and to connect it to the pertinent sensor chip in the form of a superimposed assemblage or "stacked chip" construction. The evaluation chip can have terminals or terminal surfaces on the upper and lower or front and back sides, in order to enable contacting with terminals of both the sensor chip and a housing.

What is claimed is:

1. A component having a via, comprising:
   a first layer having a first via portion, a first trench structure, and a first surrounding layer portion, wherein the first via portion is separated by the first trench structure from the first surrounding layer portion;
   a second layer having a second via portion, a second trench structure, and a second surrounding layer portion, wherein the second via portion is separated by the second trench structure from the second surrounding layer portion; and
   an insulation layer disposed between the first and the second layer, wherein the insulation layer has an opening so that the first and the second via portions of the first and the second layers are directly connected to one another in the region of the opening;
   wherein the first via portion of the first layer and the second surrounding layer portion of the second layer are disposed overlappingly with one another at least in a sub-region; and
   wherein the first and second via portions of the first and second layers are each provided with a metallization applied onto an entire surface of each of the first and second layers, the respective surfaces positioned opposite the insulation layer between the first and second layers.

2. The component as recited in claim 1, wherein one of the first layer or the second layer is a semiconductor substrate.

3. The component as recited in claim 2, wherein the second via portion of the second layer and the first surrounding layer portion of the first layer are disposed overlappingly with one another at least in a sub-region.

4. The component as recited in claim 2, further comprising:
   a sealing layer provided on the first layer and sealing the first trench structure; and
   a sealing layer provided on the second layer and sealing the second trench structure.

5. The component as recited in claim 4, further comprising:
   a metallic layer;
   wherein at least the sealing layer provided on the first layer has an opening which exposes a sub-region of the first via portion, and wherein the metallic layer is disposed on (i) the sealing layer provided on the first layer and (ii) on the exposed sub-region of the first via portion.

6. The component as recited in claim 4, wherein the sealing layer provided on the second layer has a covered conductive sub-layer which adjoins the second via portion.

* * * * *